(12) United States Patent
Yamamoto et al.

(10) Patent No.: US 7,859,444 B2
(45) Date of Patent: Dec. 28, 2010

(54) D-A CONVERTER AND D-A CONVERTING METHOD

(75) Inventors: Kazuhiro Yamamoto, Saitama (JP); Toshiyuki Okayasu, Saitama (JP)

(73) Assignee: Advantest Corporation (JP)

( * ) Notice: Subject to any disclaimer, the term of this patent is extended or adjusted under 35 U.S.C. 154(b) by 0 days.

(21) Appl. No.: 12/512,958

(22) Filed: Jul. 30, 2009

(65) Prior Publication Data

US 2010/0026541 A1 Feb. 4, 2010

Related U.S. Application Data

(63) Continuation of application No. PCT/JP2008/057293, filed on Apr. 14, 2008.

(30) Foreign Application Priority Data

Apr. 18, 2007 (JP) .............................. 2007-109833

(51) Int. Cl.
*H03M 1/66* (2006.01)
(52) U.S. Cl. ......................... 341/144; 345/89
(58) Field of Classification Search ................. 341/144; 345/89, 92, 100, 211, 58, 96; 382/233, 100; 375/240.01
See application file for complete search history.

(56) References Cited

U.S. PATENT DOCUMENTS 7,126,518 B2 * 10/2006 Tsuchi ........................ 341/144

FOREIGN PATENT DOCUMENTS

| JP | 5-206864 A | 8/1993 |
| JP | 10-308671 A | 11/1998 |
| JP | 2000-232363 A | 8/2000 |
| JP | 2001-24512 | 1/2001 |

OTHER PUBLICATIONS

International Search Report (ISR) for PCT/JP2008/057293 for Examiner consideration, citing Foreign Patent Document Nos. 1-3 listed above.
Written Option (PCT/ISA/237) of PCT/JP2008/057293.

* cited by examiner

*Primary Examiner*—Joseph Lauture
(74) *Attorney, Agent, or Firm*—Chen Yoshimura LLP

(57) ABSTRACT

Provided is a DA converter that converts an input digital signal into an analog signal, comprising an integrator that outputs an integration value of the digital signal for each cycle of a constant period; a level comparing section that makes a comparison to detect whether the integration value output by the integrator is in an excessive state of being greater than a prescribed reference value; a feedback section that subtracts a predetermined value from the integration value, based on the comparison result from the level comparing section; a timing information generating section that generates, for each cycle, timing information of a change point, at which a transition to the excessive state occurs, with units of temporal resolution shorter than the constant period, based on the integration value output by the integrator for the cycle and the integration value output by the integrator for an immediately prior cycle; a timing generating section that generates a pulse signal with units of temporal resolution shorter than the constant period based on the timing information; and a signal processing section that generates the analog signal based on the pulse signal.

8 Claims, 7 Drawing Sheets

ND-A CONVERTER AND D-A CONVERTING METHOD

CROSS REFERENCE TO RELATED APPLICATION

This is a continuation application of PCT/JP2008/57293 filed on Apr. 14, 2008 which claims priority from Japanese Patent Application No. 2007-109833 filed on Apr. 18, 2007, the contents of which are incorporated herein by reference.

BACKGROUND

1. Technical Field

The present invention relates to a DA converter and a DA converting method for converting a digital signal into an analog signal. In particular, the present invention relates to a DA converter and a DA converting method that use delta-sigma modulation.

2. Related Art

A circuit using delta-sigma modulation is known as a DA converter for converting a digital signal into an analog signal. Delta-sigma modulation involves converting a digital signal into an analog signal by performing a feedback process to subtract a prescribed reference value from an added value when the value sequentially added to the level of the digital signal becomes greater than the reference value, as shown in, for example, Japanese Patent Application Publication No. 2001-24512.

FIG. 7 shows a conventional DA converter 200. The DA converter 200 is provided with an integrator 210, a level comparing section 220, an interpolator 230, a digital delayer 260, a level subtracting section 270, and a signal processing section 280.

The interpolator 230 interpolates values between pairs of data points in the input digital signal. The integrator 210 performs integration by sequentially adding together the value of the digital signal. The level comparing section 220 outputs a signal indicating whether the output of the integrator 210 is greater than the reference value. The digital delayer 260 delays the signal output by the level comparing section 220 by one cycle. Here, "one cycle" refers to one cycle of a sampling clock supplied to the level comparing section 220. The level subtracting section 270 subtracts the value output by the digital delayer 260 from the level of the digital signal input thereto, and supplies the result to the integrator 210.

The signal processing section 280 generates an analog signal based on the signal output by the level comparing section 220. For example, the signal processing section 280 may generate the analog signal according to the distribution of the timings at which the level comparing section 220 outputs a logic value of 1.

As described above, the DA converter 200 generates the analog signal based on the timing at which the level comparing section 220 outputs a logic value of 1. Therefore, the DA converter 200 can generate the value of the analog signal with a higher resolution when the level comparing section 220 has a higher sampling frequency and a higher resolution with respect to time.

However, there is a limit to how much the sampling frequency of the level comparing section 220 can be enhanced simply by increasing the frequency of the sampling clock. Furthermore, it is difficult for the comparison result by the level comparing section 220 to be fed back to the level subtracting section 270 within a single cycle of a high-speed sampling clock.

SUMMARY

Therefore, it is an object of an aspect of the innovations herein to provide a DA converter and a DA converting method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary DA converter may include a DA converter that converts an input digital signal into an analog signal, comprising an integrator that outputs an integration value of the digital signal for each cycle of a constant period; a level comparing section that makes a comparison to detect whether the integration value output by the integrator is in an excessive state of being greater than a prescribed reference value; a feedback section that subtracts a predetermined value from the integration value, based on the comparison result from the level comparing section; a timing information generating section that generates, for each cycle, timing information of a change point, at which a transition to the excessive state occurs, with units of temporal resolution shorter than the constant period, based on the integration value output by the integrator for the cycle and the integration value output by the integrator for an immediately prior cycle; a timing generating section that generates a pulse signal with units of temporal resolution shorter than the constant period based on the timing information; and a signal processing section that generates the analog signal based on the pulse signal.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
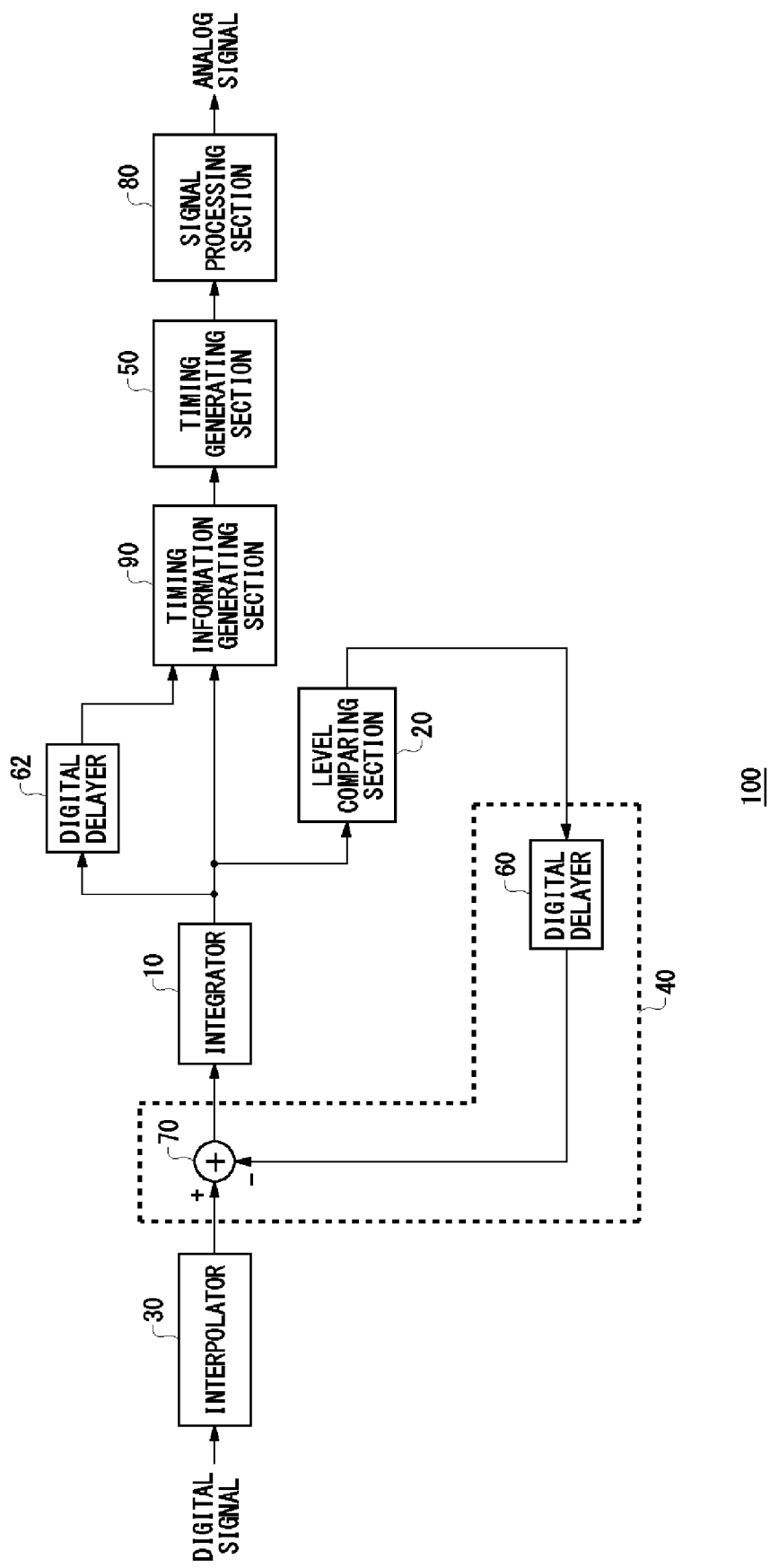
FIG. 1 shows an exemplary configuration of a DA converter 100 according to an embodiment of the present invention.

FIG. 1 shows an exemplary configuration of a DA converter 100 according to an embodiment of the present invention. The DA converter 100 is a circuit that converts an input digital signal into an analog signal, and is provided with an interpolator 30, a feedback section 40, an integrator 10, a digital delayer 62, a level comparing section 20, a timing information generating section 90, a timing generating section 50, and a signal processing section 80.

The interpolator 30 performs interpolation between data points of the input digital signal. For example, the interpolator 30 may interpolate data points in a straight line between each pair of adjacent data points of the digital signal, and insert these data points between the data points of the digital signal. Instead, the interpolator 30 may be supplied in advance with a number of data points to be interpolated between the data points of the digital signal. The interpolator 30 may insert the data points such that each data point is distributed uniformly with respect to time after the insertion.

The integrator 10 outputs, at a constant period, an integration value obtained by integrating the digital signal output by the interpolator 30. For example, when the interpolator 30 outputs data points a1, a2, a3, etc. at data intervals T, the integrator 10 outputs an integrator a1, a1+a2, a1+a2+a3, etc. at a constant period T.

The level comparing section 20 makes a comparison to detect whether the integration value output by the integrator 10 is in an excessive state, which is a state of being greater than a prescribed reference value. The level comparing section 20 may output a comparison result for each cycle.

The feedback section 40 subtracts a predetermined value from the integration value of the integrator 10, based on the comparison result of the level comparing section 20. The feedback section 40 may perform this subtraction at a timing corresponding to timing information generated by the timing information generating section 90. The feedback section 40 of the present embodiment includes a digital delayer 60 and a level subtractor 70. When the level comparing section 20 detects the excessive state, the digital delayer 60 generates a prescribed digital value. The digital delayer 60 may delay this digital value by a delay time according to the timing information, and input the delayed digital value to the level subtractor 70. The digital delayer 60 may delay the digital value by a delay time T corresponding to the constant period T.

The level subtractor 70 is provided between the interpolator 30 and the integrator 10. The level subtractor 70 subtracts the digital value output by the digital delayer 60 from the digital value to be input to the integrator 10, and inputs the result to the integrator 10.

The feedback section 40 may add the prescribed offset value to the delay amount set for the variable delay circuit 52 such that the integrated waveform is not oscillated by the period at which the level subtractor 70 subtracts the digital value. For example, the feedback section 40 may add the prescribed offset value such that the period at which the level subtractor 70 subtracts the digital value is different from the period of the digital signal.

The timing information generating section 90 generates timing information indicating the points at which the integration value output by the integrator 10 transitions to the excessive state of being greater than the reference value. The timing information generating section 90 may be supplied with the same reference value as the level comparing section 20. The timing information generating section 90 generates this timing information with units of temporal resolution that are less than the constant period T, based on the integration value output by the integrator 10 at each cycle and the output of the integrator in an immediately prior cycle. More specifically, the timing information generating section 90 generates the timing information based on a ratio between (i) the difference between the reference value and the integration value of the cycle in which the integration value becomes greater than the reference value and (ii) the difference between the reference value and the integration value of the cycle immediately prior to the above cycle. An exemplary operation of the timing information generating section 90 is described further below with reference to FIG. 2.

The timing information generating section 90 of the present embodiment receives an integration value for each cycle form the integrator 10, and receives an integration value for each corresponding prior cycle from the digital delayer 62. For example, the digital delayer 62 may receive the branched output of the integrator 10, delay this input by the delay time T, and supply the delayed result to the timing information generating section 90.

The timing generating section 50 generates a _ having a phase according to the timing information supplied from the timing information generating section 90. For example, the timing generating section 50 may generate the _ by delaying the pulse supplied thereto based on the timing information supplied thereto. As a result of this process, the digital value generated by the timing information generating section 90 can be converted into an analog amount on the time axis.

The signal processing section 80 generates the analog signal based on the _ output by the timing generating section 50. For example, the signal processing section 80 may include a low-pass filter that passes a prescribed low-frequency component of the _. The signal processing section 80 may have the same configuration as the signal processing section of a conventional DA converter using delta-sigma modulation.

Figure 2:
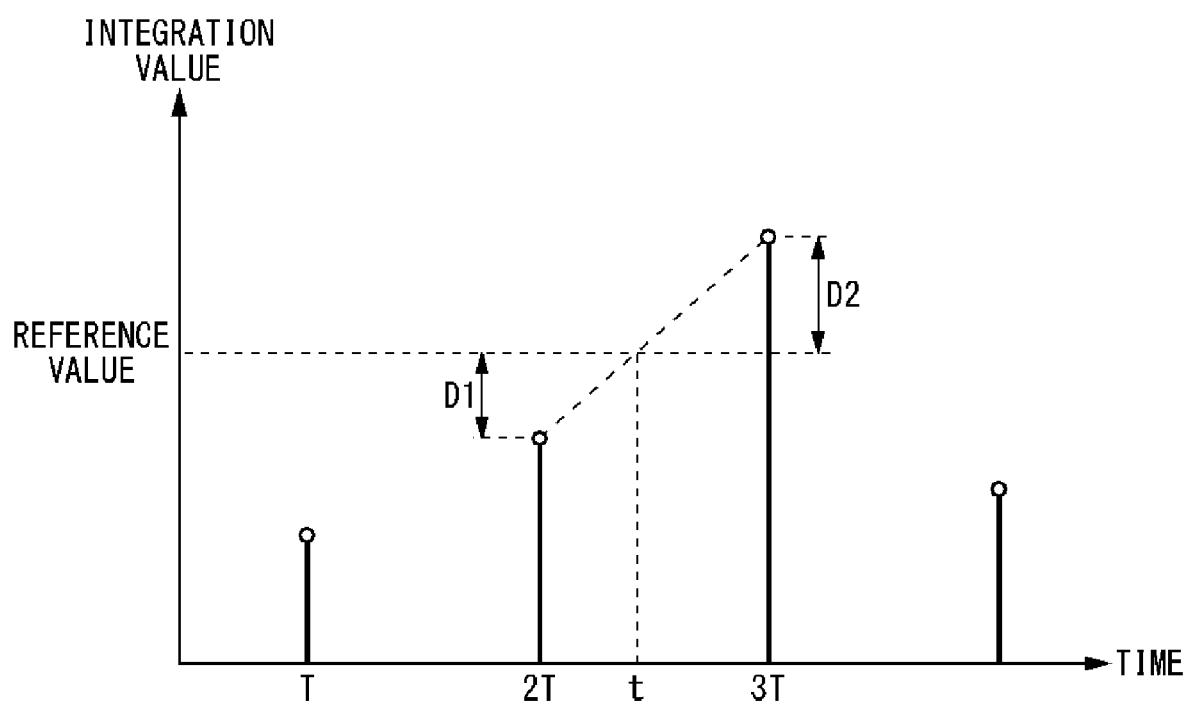
FIG. 2 describes an exemplary operation of the timing information generating section 90.

FIG. 2 describes an exemplary operation of the timing information generating section 90. In FIG. 2, the horizontal axis represents time, and the vertical axis represents the integration value. In the present example, the integration value is less than the reference value by D1 at the time 2T, and is greater than the reference value by D2 at the time 3T. As described above, the timing information generating section 90 calculates the timing t at which the integration value becomes greater than the reference value based on the ratio between D1 and D2. For example, as shown in FIG. 2, the timing information generating section 90 may calculate the timing t at which the integration value becomes greater than the reference value by performing linear interpolation between the integration value at the time 2T and the integration value at the time 3T. The timing t may be calculated in each cycle using the expression $t=(D1 \times T)/(D1+D2)$.

With this process, the timing information can be generated at units of temporal resolution that are shorter than the operational period of the integrator 10. Therefore, the DA converter 100 can generate the analog signal with a higher resolution.

Figure 3:
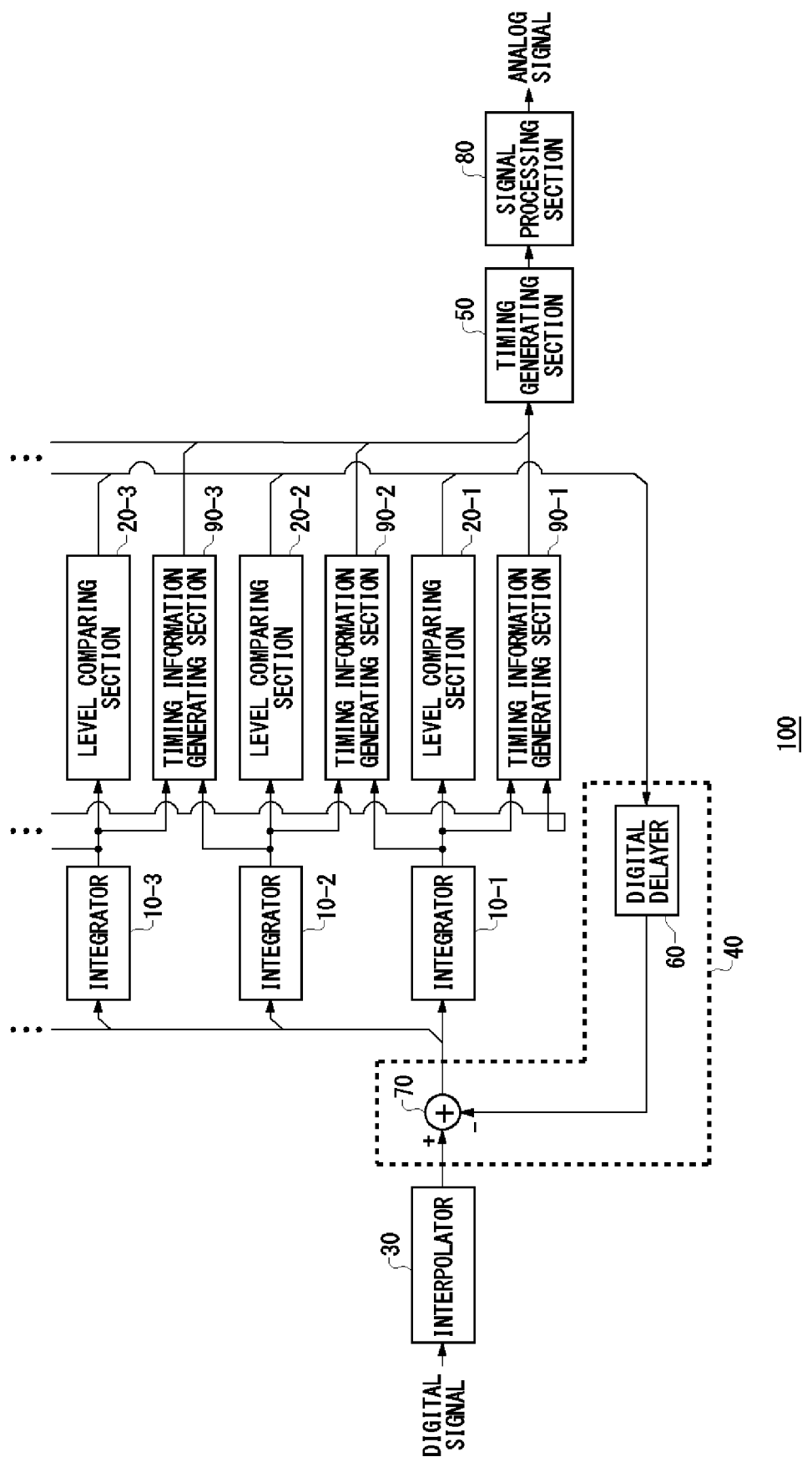
FIG. 3 shows another exemplary configuration of the DA converter 100.

FIG. 3 shows another exemplary configuration of the DA converter 100. The DA converter 100 of the present embodiment differs from the DA converter 100 described in relation to FIG. 1 in that the DA converter 100 of the present embodiment is provided with a plurality of groups each made up of an integrator 10, a level comparing section 20, and a timing information generating section 90. Aside from this point, the DA converter 100 of the present embodiment may have the same configuration as the DA converter 100 described in relation to FIG. 1.

Figure 4:
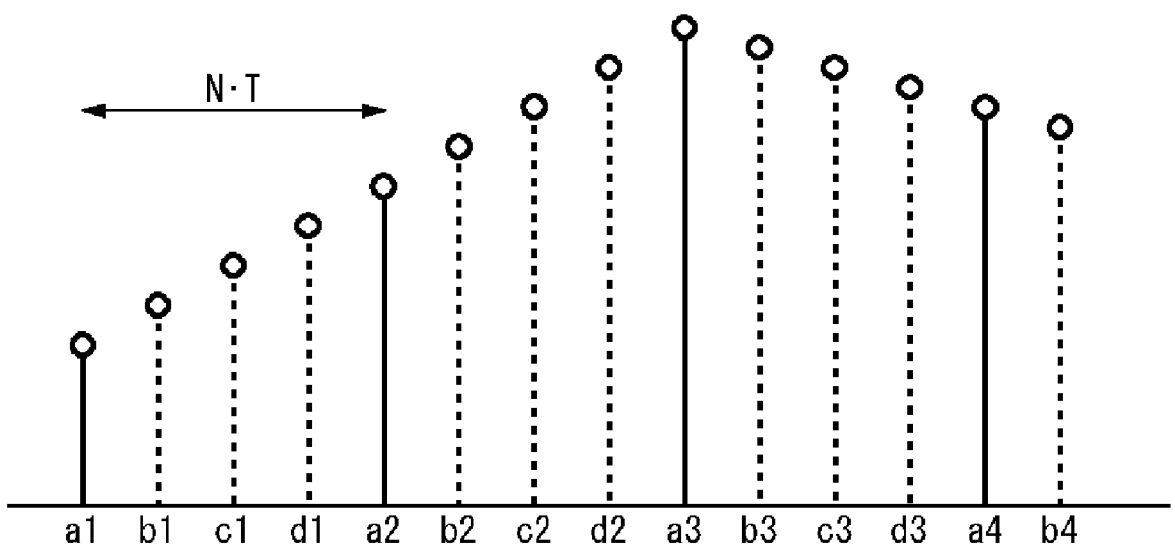
FIG. 4 describes an exemplary operation of the interpolator 30.

FIG. 4 describes an exemplary operation of the interpolator 30 shown in FIG. 3. In this example, the data interval of the original digital signal input to the interpolator 30 is N×T, where N is an integer greater than 1. The data points a1, a2, a3, etc. shown by solid lines in FIG. 4 represent the data points of the digital signal input to the interpolator 30 at data bit intervals of N×T. The data points b1, c1, d1, b2, c2, d2, etc. shown by dotted lines in FIG. 4 represent data points inserted by the interpolator 30 at data intervals of T. In FIG. 4, N=4, which means that three interpolated data points are inserted between each original data point of the digital signal.

The plurality of integrators 10 are provided in parallel. The plurality of level comparing sections 20 are provided to correspond one-to-one with the plurality of integrators 10. The plurality of timing information generating sections 90 are also provided to correspond one-to-one with the plurality of integrators 10.

The plurality of integrators 10 are respectively associated with different timings in a cycle having a constant period. This association may be set in advance by a user or the like. Here, a "constant period" may refer to the data bit interval N×T of the digital signal input to the interpolator 30, as shown in FIG. 4. When generating a digital signal with a higher resolution, the "constant period" may refer to a period shorter than the data bit interval N×T. Furthermore, the phrase "different timings in a cycle" may refer to the timings corresponding to the data points ak, bk, ck, dk shown in FIG. 4, where k is an integer greater than or equal to 1.

The interpolator 30 may perform the interpolation between the data points of the digital signal according to the number of integrators 10 provided. For example, the interpolator 30 may insert, between each pair of adjacent data points of the digital signal, a number of data points equal to the number of integrators 10 minus 1. The interpolator 30 may insert this number of data points into the digital signal for each of the constant periods described above. In the present embodiment, there are four integrators 10 provided, and the constant period is set as the data bit interval N×T.

In this case, the first integrator 10-1 is associated with the timings of the data points a1, a2, a3, etc., the second integrator 10-2 is associated with the timings of the data points b1, b2, b3, etc., the third integrator 10-3 is associated with the timings of the data points c1, c2, c3, etc., and the fourth integrator 10-4 is associated with the timings of the data points d1, d2, d3, etc. Each integrator 10 outputs, in each cycle, the integration value of the digital signal as calculated up to the associated timing. Each integrator 10 may be supplied with the data points corresponding to each cycle.

For example, the first integrator 10-1 outputs the value of the data point a1 in the first cycle, and outputs a value obtained by adding together the values of the data points from a1 to a2 in the second cycle. In the same way, the second integrator 10-2 outputs a value obtained by adding together the values of the data points from a1 to b1 in the first cycle, and outputs a value obtained by adding together the values of the data points from a1 to b2 in the second cycle. In this way, the other integrators 10 also output, in each cycle, a value obtained by integrating the digital signal up to the associated timing. As a result of this process, the DA converter 100 can measure the integration value of the digital signal with a high temporal resolution, without accelerating the operational period of each integrator 10, e.g. in the present embodiment, the operational period is approximately equal to the data bit interval N×T of the original digital signal.

Each level comparing section 20 makes a comparison to detect whether the integration value output by the corresponding integrator 10 is in the excessive state of being greater than the prescribed reference value. Each level comparing section 20 may output a comparison result for each cycle. Each level comparing section 20 may be the same as the level comparing section 20 described in relation to FIG. 1.

Each timing information generating section 90 is supplied with (i) the integration value output by the corresponding integrator 10 and (ii) the integration value output by the integrator 10 associated with the timing immediately prior to the timing associated with the corresponding integrator 10. In other words, each timing information generating section 90 is supplied with the integration value output by the integrator 10 in each cycle and the integration value delayed by the data interval T, in the same way as the timing information generating section 90 described in relation to FIG. 1. When the output of the corresponding integrator 10 reaches the reference value without the output of the integrator 10 associated with the immediately prior timing reaching the reference value, the timing information generating section 90 may generate the timing information by calculating the timing according to the ratio between (i) the difference between the prior integration value and the reference value and (ii) the difference between the latter integration value and the reference value, in the same manner as the timing information generating section 90 described in relation to FIG. 1.

In other words, when the integration value exceeds the reference value in a period T within the period N×T, the corresponding timing information generating section 90 generates timing information indicating that the integration value has exceeded the reference value at a certain timing within this period. Therefore, when the integration value exceeds the reference value in a cycle within the period N×T, the DA converter 100 can detect, for each cycle, the timing at which the integration value exceeded the reference value in the cycle, based on the plurality of pieces of timing information output by the plurality of the timing information generating sections 90 in each cycle.

The feedback section 40 subtracts a predetermined value from the integration value of each integrator 10, based on the comparison result from the corresponding level comparing section 20. When one of the plurality of level comparing sections 20 detects the excessive state, the feedback section 40 may subtract the predetermined value from each integration value at a timing that depends on which of the level comparing sections 20 detected the excessive state.

The feedback section 40 of the present embodiment subtracts a prescribed value from each integration value by subtracting the prescribed value from the digital signal input to the corresponding integrator 10, at a timing corresponding to the timing information supplied for each cycle. More specifically, the prescribed value may be subtracted from the digital value input to each integrator 10 at a timing corresponding to the bit position at which the logic value transitions from 0 to 1 in the timing information.

The feedback section 40 includes a digital delayer 60 and a level subtractor 70. The digital delayer 60 generates a prescribed digital value at a timing corresponding to the timing information supplied for each cycle. This digital value may be determined according to the reference value of the level comparing section 20. For example, each level comparing section 20 may have the same reference value, and this digital value may be the same as the reference value. As another example, the digital delayer 60 may generate the digital value according to a duration over which the excessive state continues.

The level subtractor 70 is provided between the interpolator 30 and the integrators 10. The level subtractor 70 subtracts the digital value output by the digital delayer 60 from the digital value to be input to each of the integrators 10, and inputs the result to the integrators 10.

The feedback section 40 may add the prescribed offset value to the delay amount set for the variable delay circuit 52 such that the integrated waveform is not oscillated by the period at which the level subtractor 70 subtracts the digital value. For example, the feedback section 40 may add the prescribed offset value such that the period at which the level subtractor 70 subtracts the digital value is different from the period of the digital signal.

The timing generating section 50 receives the timing information from the plurality of timing information generating sections 90 and generates a _ with a phase corresponding to the timing information. When the integration value exceeds the reference value in a cycle within the period N×T, the timing generating section 50 may detect the timing in the cycle at which the integration value exceeded the reference value based on the plurality of pieces of timing information received for each cycle. The timing generating section 50 may then, for example, generate the _ by delaying the pulse supplied for each cycle according to the detected timing. As a result of this process, the DA converter 100 can convert digital information output by the plurality of timing information generating sections 90 into an analog amount on the time axis.

The signal processing section 80 generates the analog signal based on the _ output by the timing generating section 50. For example, the signal processing section 80 may include a low-pass filter that passes a prescribed low-frequency component of the _. The signal processing section 80 may have the same configuration as the signal processing section of a conventional DA converter using delta-sigma modulation.

By providing the plurality of integrators 10, timing information generating sections 90, and level comparing sections 20 in parallel to generate integration values in parallel that have a scope of integration that gradually shifts over time, the operating speed of each integrator 10, timing information generating section 90, and level comparing section 20 can be decreased while enabling generation of a digital signal with a high resolution.

Figure 5:
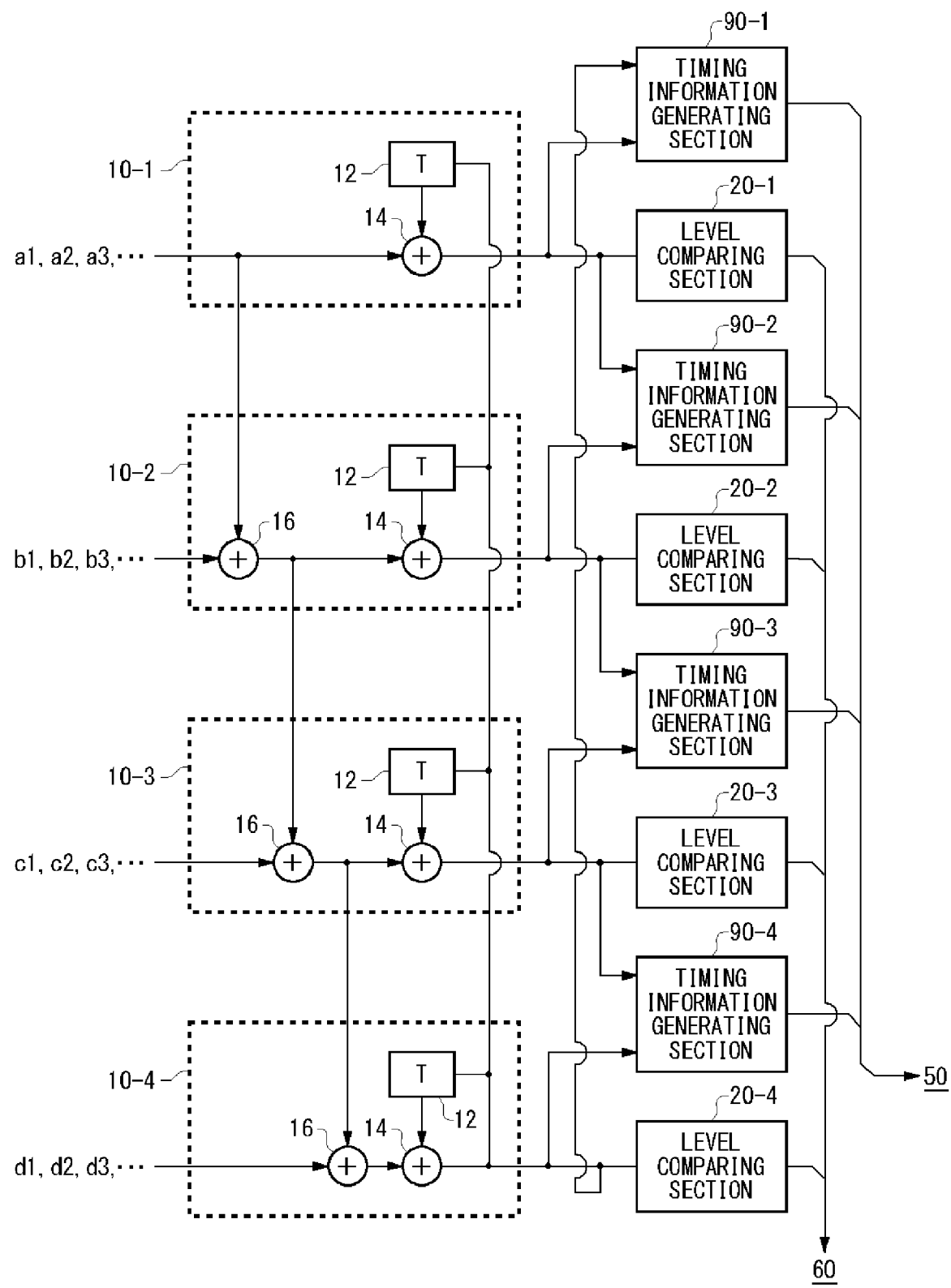
FIG. 5 shows exemplary configuration of the plurality of integrators 10.

FIG. 5 shows another exemplary configuration of the plurality of integrators 10. It should be noted that the configuration of the integrators 10 is not limited to the configuration shown here. Many different configurations can be adopted to achieve the effect of the integrators 10 described above. Each integrator 10 includes a first adding section 14, a second adding section 16, and a delay section 12, but one of the integrators 10 need not include a second adding section 16. In the present embodiment, the first integrator 10-1, which is associated with the earliest timing from among the timings in a cycle, does not include a second adding section 16.

Each integrator 10 is supplied with the data of the associated timing at each cycle of the period N×T. For example, the first integrator 10 is sequentially supplied with the data points a1, a2, a3, etc. in each cycle. The second integrator 10 is sequentially supplied with the data points b1, b2, b3, etc. in each cycle.

Each second adding section 16 adds together (i) the data output by the second adding section 16 in the integrator 10 at the prior stage and (ii) the data input to its own integrator 10. However, it should be noted that the second adding section 16 of the second integrator 10-2 adds together the data input to the first integrator 10-1 and the data input to the second integrator 10-2.

Each first adding section 14 adds together (i) the data output by the corresponding second adding section 16 or, in the case of the first integrator 10-1, the data input to the first integrator 10-1, and (ii) the data output by the first adding section 14 of the integrator 10 at the last stage in the previous cycle. Each delay section 12 delays, by a prescribed time, the data output by the first adding section 14 of the integrator 10 at the last stage, and inputs the result to the corresponding first adding section 14. Here, the prescribed time may be the data bit interval N×T of the original digital signal, as described in FIG. 4.

With this configuration, the operating speed of each integrator 10 can be decreased to be approximately equal to the data bit interval N×T of the original digital signal, while enabling measurement of the integration value of the digital signal with a high temporal resolution, as described in FIGS. 3 and 4. Furthermore, by supplying the output of each integrator 10 to the corresponding level comparing section 20 and the corresponding timing information generating section 90, the comparison period of each level comparing section 20 can be decreased to be approximately equal to the data bit interval N×T of the original digital signal, while enabling the timing at which the integration value exceeds the reference value to be detected with a high temporal resolution.

Figure 6:
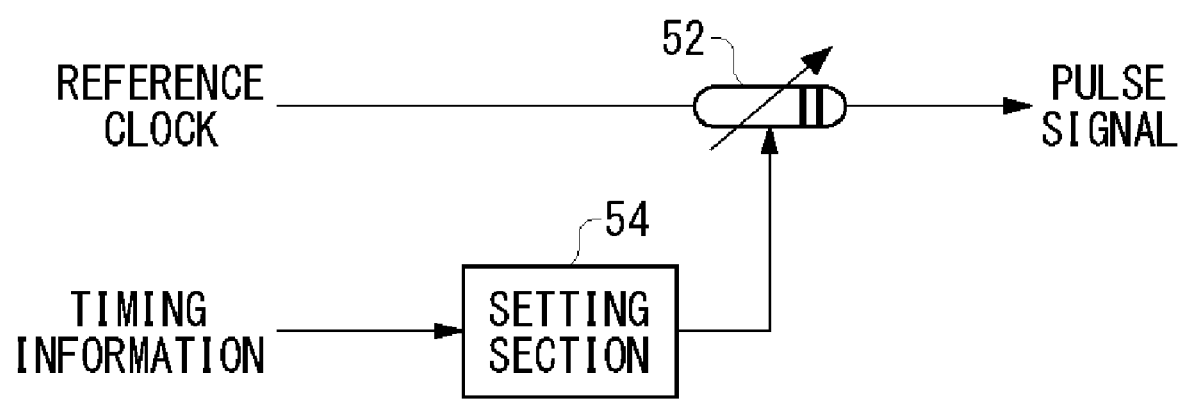
FIG. 6 shows an exemplary configuration of the timing generating section 50.
Figure 7:
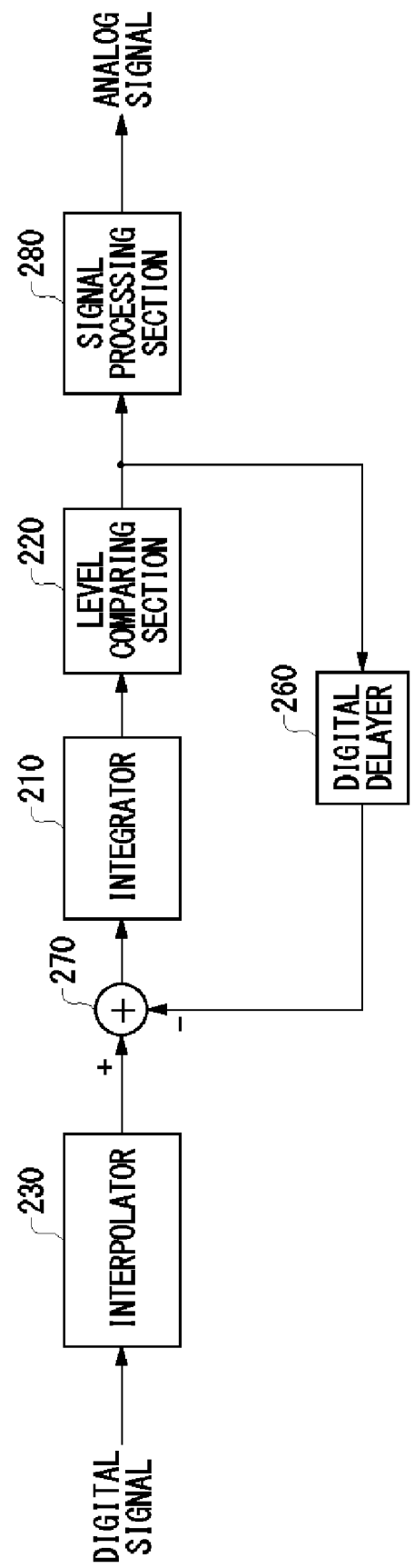
FIG. 7 shows a conventional DA converter 200.

FIG. 6 shows an exemplary configuration of the timing generating section 50. The timing generating section 50 includes a variable delay circuit 52 and a setting section 54. The variable delay circuit 52 delays a reference clock and outputs the result. In the example of FIG. 1, the period of the reference clock may be approximately equal to the data bit interval T of the digital signal. In the example of FIG. 3, the period of the reference clock may be approximately equal to the data bit interval N×T of the original digital signal. The setting section 54 sets the delay amount of the variable delay circuit 52 based on the timing information. For example, the setting section 54 may receive timing information for each cycle of the reference clock, and set the delay amount of the variable delay circuit 52 with respect to the subsequent cycle of the reference clock based on the timing information of each cycle. If a logic value transition is not detected in the timing information, the setting section 54 may control the variable delay circuit 52 such that the reference clock pulse is not output in the subsequent cycle.

As described above, the embodiments of the present invention can be used to realize a delta-sigma DA converter that can integrate a digital signal with enhanced temporal resolution. Therefore, the DA converter can accurately generate an analog signal.

The embodiments above provide a delta-sigma DA converter that can increase the temporal resolution of the integration of a digital signal. Therefore, the delta-sigma DA converter can accurately generate an analog signal.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A DA converter that converts an input digital signal into an analog signal, comprising:

an integrator that outputs an integration value of the digital signal for each cycle of a constant period;

a level comparing section that makes a comparison to detect whether the integration value output by the integrator is in an excessive state of being greater than a prescribed reference value;

a feedback section that subtracts a predetermined value from the integration value, based on the comparison result from the level comparing section;

a timing information generating section that generates, for each cycle, timing information of a change point, at which a transition to the excessive state occurs, with units of temporal resolution shorter than the constant period, based on the integration value output by the integrator for the cycle and the integration value output by the integrator for an immediately prior cycle;

a timing generating section that generates a pulse signal with units of temporal resolution shorter than the constant period based on the timing information; and a signal processing section that generates the analog signal based on the pulse signal.

2. The DA converter according to claim 1, wherein the timing information generating section generates, for each cycle, with units of temporal resolution shorter than the constant period, the timing information corresponding to a ratio between (i) a difference between the reference value and the integration value of the cycle and (ii) a difference between the reference value and the integration value of an immediately prior cycle.

3. The DA converter according to claim 1, further comprising an interpolator that performs an interpolation between pairs of data points of the digital signal.

4. The DA converter according to claim 1, wherein the signal processing section includes a low-pass filter that passes a prescribed frequency component of the pulse signal.

5. The DA converter according to claim 1, wherein the feedback section subtracts a predetermined value form the integration value when the level comparing section detects the excessive state.

6. The DA converter according to claim 1, wherein the feedback section subtracts a predetermined value from the integration value according to the timing information generated by the timing information generating section.

7. The DA converter according to claim 1, comprising:

a plurality of the integrators that are provided in parallel and preset to each have a different timing within a cycle of the constant period, and that output, for each cycle, an integration value of the digital signal calculated up until the associated timing;

a plurality of the level comparing sections that are provided to correspond one-to-one with the plurality of integrators, and that each make a comparison to detect whether the integration value output by the corresponding integrator is in the excessive state of being greater than the prescribed reference value; and a plurality of the timing information generating sections that are provided to correspond one-to-one with the plurality of integrators, and that generate the timing information based on the integration value output by the corresponding integrator and the integration value output by an integrator associated with a timing immediately prior to the timing associated with the corresponding integrator.

8. A DA converting method for converting an input digital signal into an analog signal, comprising:

outputting an integration value of the digital signal for each cycle of a constant period;

making a comparison to detect whether the output integration value is in an excessive state of being greater than a prescribed reference value;

subtracting a predetermined value from the output integration value, based on a result of the comparison;

generating, for each cycle, timing information of a change point, at which a transition to the excessive state occurs, with units of temporal resolution shorter than the constant period, based on the output integration value for the cycle and the output integration value for an immediately prior cycle;

generating a pulse signal with units of temporal resolution shorter than the constant period based on the timing information; and generating the analog signal based on the pulse signal.

* * * * *